United States Patent [19]

Russell

[11] Patent Number: 5,511,035

[45] Date of Patent: Apr. 23, 1996

[54] OPTICAL RANDOM ACCESS MEMORY HAVING DIFFRACTIVE SIMPLEX IMAGING LENS

[75] Inventor: James T. Russell, Bellevue, Wash.

[73] Assignee: Information Optics Corporation, Issaquah, Wash.

[21] Appl. No.: 272,672

[22] Filed: Jul. 7, 1994

Related U.S. Application Data

[63] Continuation-in-part of Ser. No. 815,924, filed PCT/US92/11356, Dec. 30, 1992.

[51] Int. Cl.$^6$ .................................................. G11C 11/42
[52] U.S. Cl. ........................... 365/234; 365/235; 365/120; 365/124; 365/125; 365/10; 250/216; 250/578.1; 250/237 R
[58] Field of Search ............................ 369/112; 365/234, 365/235, 120, 124, 10; 250/216, 578.1, 237 R

[56] References Cited

U.S. PATENT DOCUMENTS

| | | |
|---|---|---|
| 3,191,157 | 6/1965 | Parker et al. . |
| 3,573,433 | 4/1971 | Harris . |
| 3,637,307 | 1/1972 | Spitz . |
| 3,656,120 | 4/1972 | Maure . |
| 3,676,864 | 7/1972 | Maure et al. . |
| 3,704,068 | 11/1972 | Waly . |
| 3,765,749 | 10/1973 | LaMacchia . |
| 3,806,643 | 4/1974 | Russell . |
| 3,860,917 | 1/1975 | Auria . |
| 3,885,094 | 5/1975 | Russell . |
| 3,898,005 | 8/1975 | Roberts . |
| 3,899,778 | 8/1975 | Roberts . |
| 3,952,290 | 4/1976 | Williams . |
| 3,996,570 | 12/1976 | Roberts . |
| 4,021,606 | 5/1977 | Takeda et al. . |
| 4,227,212 | 10/1980 | Woolfson et al. . |
| 4,663,738 | 5/1987 | Sprague et al. ........................ 365/127 |
| 4,682,861 | 7/1987 | Hosoya . |
| 4,727,533 | 2/1988 | Erbert ..................................... 369/112 |
| 4,743,091 | 5/1988 | Gelbart . |
| 4,745,417 | 5/1988 | Inokuchi . |
| 4,794,245 | 12/1988 | Auer . |
| 4,807,978 | 2/1989 | Grinberg et al. ...................... 350/3.73 |
| 4,899,224 | 2/1990 | Ooba et al. . |
| 4,988,153 | 1/1991 | Paek . |
| 5,007,690 | 4/1991 | Chern et al. . |
| 5,013,107 | 5/1991 | Biles . |
| 5,138,604 | 8/1992 | Umeda et al. . |
| 5,321,639 | 6/1994 | Krishnamoorthy et al. ............ 364/606 |
| 5,340,978 | 8/1994 | Rostoker et al. .................... 250/208.1 |

FOREIGN PATENT DOCUMENTS 1188220  4/1970  United Kingdom .

*Primary Examiner*—Viet Q. Nguyen
*Attorney, Agent, or Firm*—Graybeal Jackson Haley & Johnson

[57] ABSTRACT

An optical memory stores data in an optical data layer capable of selecting altering light such as by changeable transmissivity. Data is organized into a plurality of regions or patches (called pages) in which each page contains a field of data spots storing binary data as the presence or absence of a hole. The data is illuminated by controllable light sources and an array of single element diffractive imaging lenslets, one for each data page, projects the image onto a common array of light sensors. By selective illumination of each data page, one of the single element lenslets images the selected data page of holes onto the light sensors. By selecting a hole size and using a certain range of restricted acceptance angle grooves on the diffractive elements, the data image is optimized for a single diffractive element lens.

12 Claims, 5 Drawing Sheets

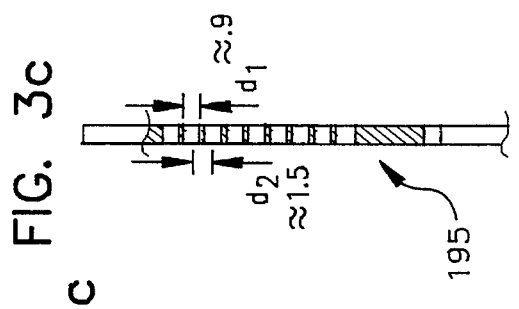
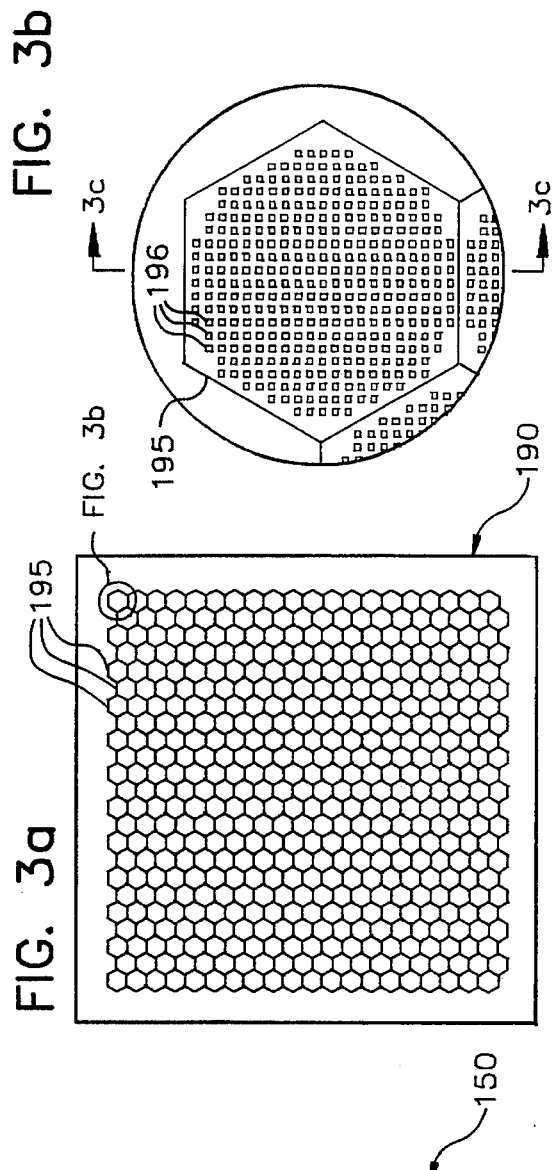
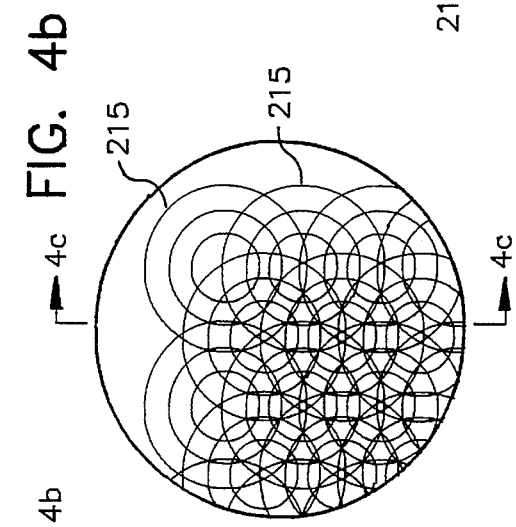
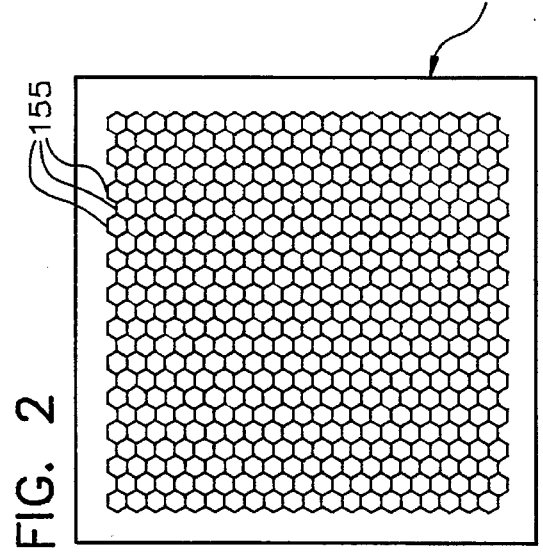
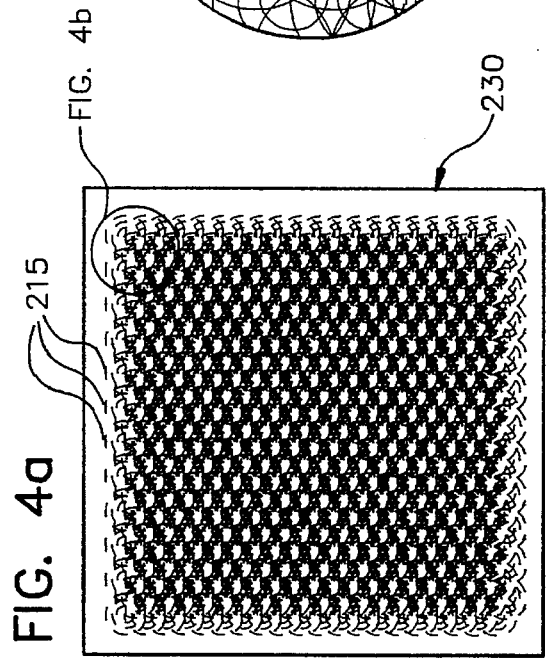

OPTICAL RANDOM ACCESS MEMORY HAVING DIFFRACTIVE SIMPLEX IMAGING LENS

CROSS REFERENCE TO RELATED APPLICATIONS

This is a continuation-in-part of U.S. patent application Ser. No 07/815,924, filed Dec. 30, 1991, and international patent application Ser. No. PCT/US92/11356, filed Dec. 30, 1992, by James T. Russell for OPTICAL RANDOM ACCESS MEMORY.

BACKGROUND OF THE INVENTION

The invention relates to optical storage and retrieval of digital data stored as light altering characteristics on an optical material and, more particularly, to an imaging lens therefor.

Optical memories of the type having large amounts of digital data stored by light modifying characteristics of a film or thin layer of material and accessed by optical addressing without mechanical movement have been proposed but have not resulted in wide spread commercial application. The interest in such optical recording and retrieval technology is due to its projected capability of faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. The serial accessing of data generally requires transfer to a buffer or solid state random access memory of a data processor in order to accommodate high speed data addressing and other data operations of modern computers. Solid state ROM and RAM can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U.S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above mentioned objectives of the present invention, they fall short in one or more respects.

For example, some of the systems proposed above have lens or other optical structure not capable of providing the requisite resolution to retrieve useful data density. The optical resolution of the data image by these prior lens systems does not result in sufficient data density and data rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data. Because of inherent overlap in imaging lens elements of close-pack arrays, it would be desirable to use all diffractive elements and, if possible, just a single diffractive surface. However, there are basic optical system constraints to consider. There is a defining aperture in any optical system. This aperture may be just the edges of one of the optical elements, or it (preferably, in visual devices) may be operating in a diaphragm. In optical design terms, this aperture is called the stop. The stop sets the size of the ray bundles, and it sets the location and direction of each bundle throughout the optical system. The location of the stop can have a very significant effect on image quality. For example, the aperture stop may be located at the lens. The central ray from each point in a field (such as each bit in a field of data) must pass through the center of the stop, i.e., the lens. In another example, the stop may be placed a long distance beyond the lens. The central rays still are aimed at the center of the stop, so they do not go through the center of the lens, necessarily.

In the first example, the resulting image is poor, especially for the full field bits. The reason is that all rays from all field points must pass through the same area of the same lens, hence will be acted upon in a similar way. But the ray bundles that come from a non-central field point will be going through a tilted lens, which will distort the image.

In the second example, with a lens optimized with the stop a long distance away beyond the lens and image plane, the resulting images are good for both on- and off-axis. This is because the off-axis bundles go though the lens in an asymmetric pattern, and use a partly different lens area. Since the lens can be aspheric, a large field can be accommodated.

Although the image is good for the second example, the image spot is ⅔ larger than previous lens systems using two (or more) lens elements. Therefor, other things being equal, the density of a system using a single lens will be less. Such lower density may be acceptable for certain applications.

However, there are further constraints on a single element design. In the above second example, a good image is obtained because the stop restricted the off-axis ray bundles to one side of the lens. However, this stop is an artificial construct. There can be no actual physical stop out beyond the image. In fact, because of adjacent pages, the only place to put an actual stop is at (or before) the lens. A diaphragm with a hole cannot be used at the lens, either, (because of the overlap) but the lens edges would form the stop. A stop before the lens does not work, because the bundles will be directed to the wrong side of the lens, tending to over bend the marginal rays.

SUMMARY OF INVENTION

In accordance with the invention, an optical random access memory uses an array of single element diffractive lenslets, one for each patch or page of data on a data layer, and corrects for certain inherent difficiencies of single lens systems by creating an effect, like a distant stop, by controlling the way the bundles of data bit light rays intersect the diffractive element. This artificial or virtual distant stop is created by preferentially illuminating the lens on the same side of the lens axis as the data field point or bit that is to be imaged. To do so, first the divergence of the light from a transparent bit depends on the size of the bit (hole) with respect to the wavelength of source light, and secondarily on the divergence of the illuminating source. To the extent that the bit is very small, the output distribution is an elongated lobe, i.e., an equal intensity contour would be a circle that is tangent to the bit. By selecting a bit size and an illumination divergence that restricts the divergence and direction of the light coming from a bit, the resulting strongest intensity portion of the bit profile can be directed to that part of the lens that is effective for that field location, leaving other bit rays to be attenuated. Secondly, the efficiency of a diffractive lens depends not only on the blaze, but on the acceptance angle at a groove. A groove is a 3 dimensional structure. The aspect ratio, or depth to width ratio, is chosen according to the invention to be in the range of 1:1 to 4:1 or more, depending on the change in the index of refraction across the lens and is preferrably 3:1 or greater. By using a larger aspect ratio for the diffraction grooves, the acceptance angle for incoming light is increasingly restricted. The present invention selects this aspect ratio to restrict the acceptance angle to reduce the efficiency for rays coming from the opposite side of the lens axis, and thereby achieves with the first effect above, further discrimination and hence attenuation or suppression of "bad" light rays, i.e., those that would distort the image.

BRIEF DESCRIPTION OF THE DRAWINGS

FIG. 2 is a plan view diagrammatically illustrating the arrangement of multiple hexagonal light sources used for selectively illuminating patches or pages of data in a preferred embodiment of the apparatus using the present invention.

FIGS. 3a, 3b and 3c are respectively a plan view, an enlarged fragmentary view and a further enlarged cross-sectional view of the arrangement of the data in patches or pages in accordance with the preferred embodiment.

FIGS. 4a, 4b and 4c are respectively a plan view, an enlarged fragmentary view and a further enlarged cross-sectional view of the simplex diffractive lens array in which each page of data is imaged by a single diffractive lens element or surface.

DETAILED DESCRIPTION

Figure 1:
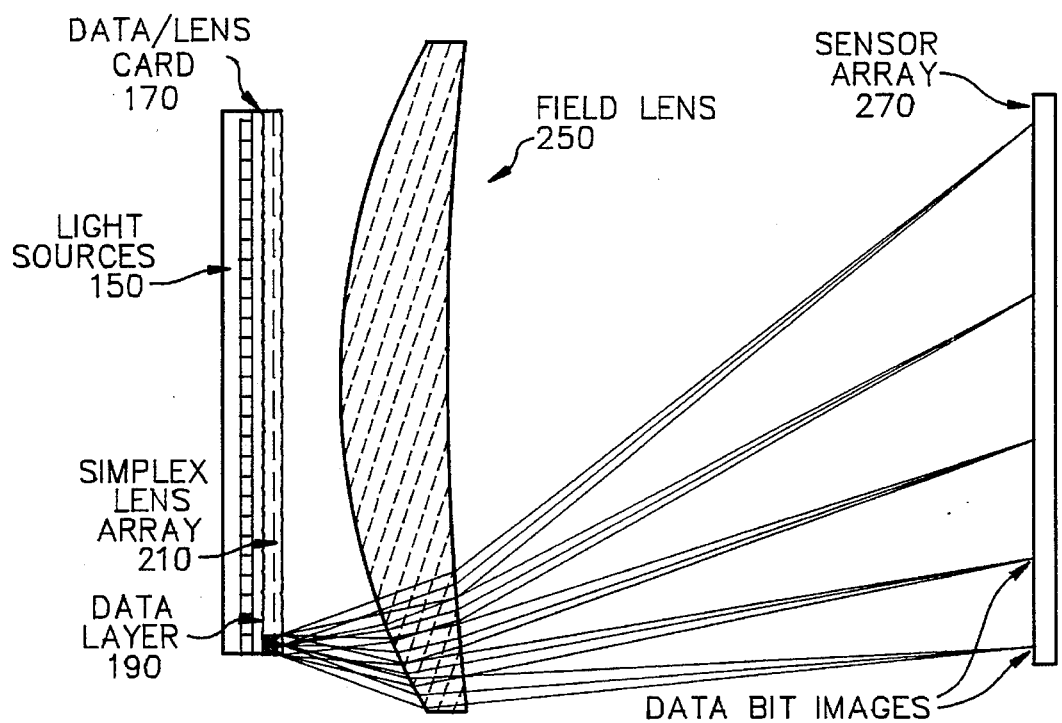
FIG. 1 is a diagrammatic view of the optical random access memory having a diffractive simplex lens array for storing and retrieving data in accordance with the invention.
Figure 7A:
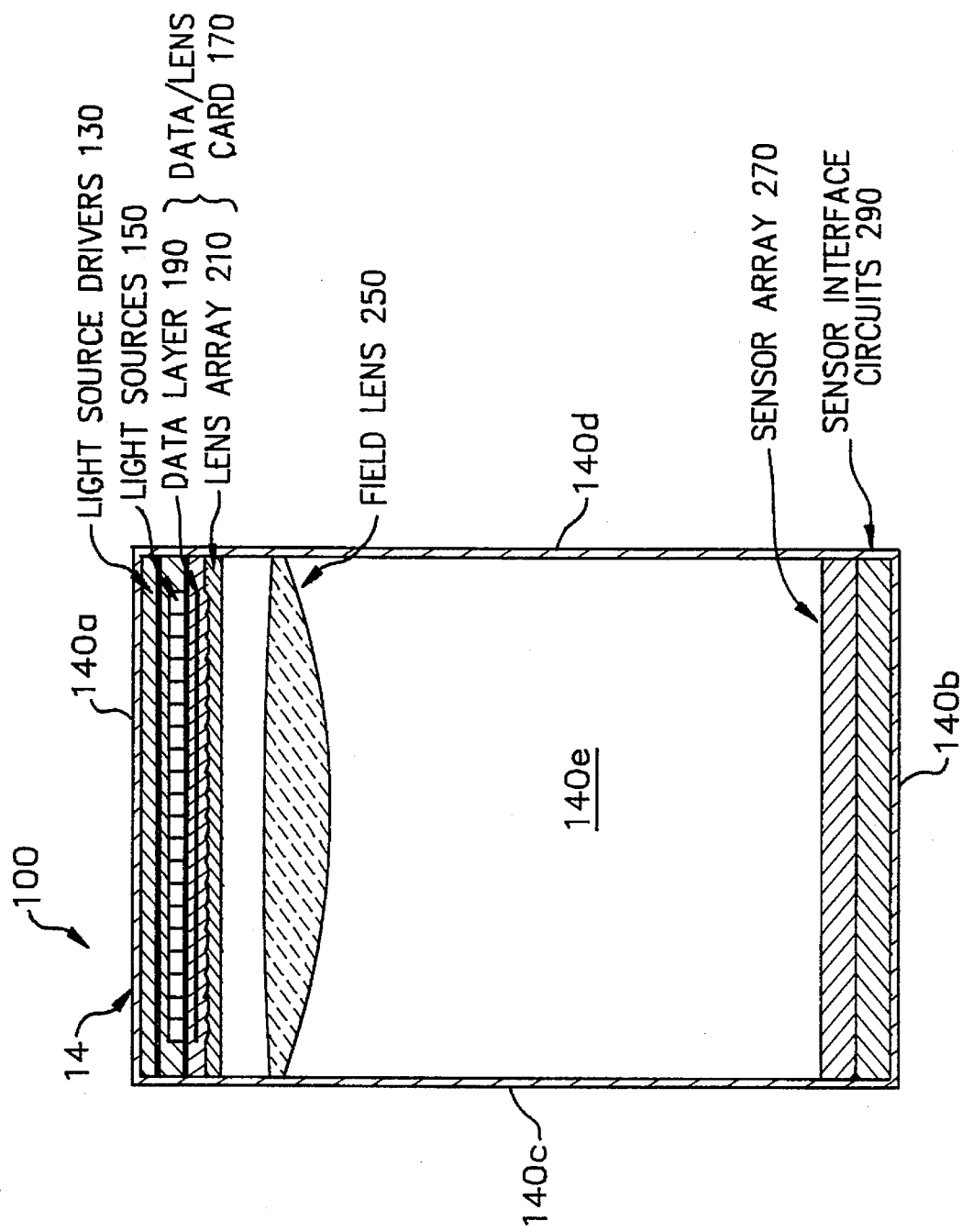
FIG. 7a and 7b are respectively a front elevation view of an optical random access memory device incorporating the simplex diffractive lens array of the present invention and an electronic block diagram of the interface circuits for accessing data stored in the data layer.
Figure 7B:
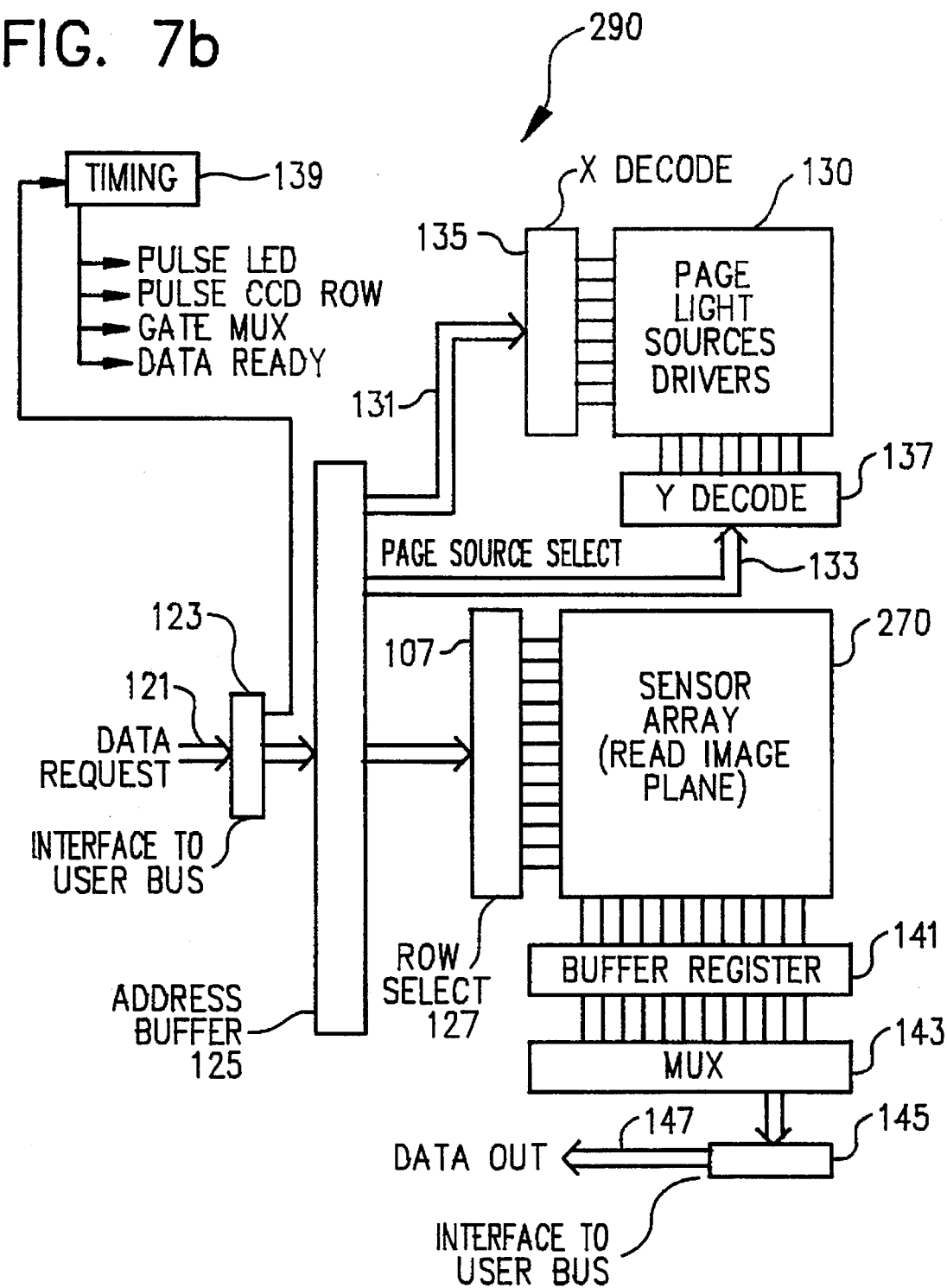

As shown in FIG. 1, the data layer 190 for storing optical data is formed as part of a data/lens card 170 which incorporates, in accordance with the present invention, a simplex lens array 210 that is characterized by a single diffractive element or surface for each page of data to be imaged on sensor array 270. This single diffractive element, one per data page, collects data image light created by energizing one of multiple light sources (omitted in FIG. 1 but shown in the complete memory apparatus of FIG. 7a) and causes the image rays to be processed for creating an image on sensor array 270 through an intervening field lens 250 that is common to all of the data pages in layer 190 and all of the diffractive simplex elements of array 210. Other than the unique optical and structural characteristics of the simplex lens array 210 of the present invention, the basic construction and operation of the optical random access memory shown in FIG. 1 and more completely in the apparatus of FIG. 7a and 7b, are disclosed in related co-pending U.S. patent application Ser. No. 07/815,924 and international patent application Ser. No. PCT/US92/11356, the published specifications of which are incorporated herein by reference. Thus, as in the above mentioned related applications, data/lens card 170 is constructed as a unitary component formed by bonding together the various layers including the data layer 190 and, in this case, the simplex diffractive lens array 210, so that card 170 is removable and replaceable by other like constructed data cards for storing different data, into the memory 100 shown in FIG. 7a.

Unique to the present invention is the economy of manufacturing data/lens card 170 with an array 210 which has but one surface, that being diffractive, for each of the data pages. As discussed in greater detail below, the present invention is capable of resolving the relatively dense data on layer 190 by using a specially constructed grating that forms the diffractive surface of lens array 210 and by requiring that the data bits or spots on the data layer 190 be configured so as to produce a certain light dispersion envelope that co-functions with the specially configured diffractive grating on the lens element to differentially reject light rays from the data layer that are not capable of being focused sharply on sensor array 270.

To better understand the structural and optical requirements of the data/lens card 170 in accordance with the present invention, reference is made to FIGS. 3a, b and c, and 4a, b and c, showing respectively the data layer and the configuration of the patches or data pages, and the simplex diffractive element or surface, including the overlapping concentric grating patterns and specially configured grating grooves. Thus, in FIG. 3a, the data layer 190 is organized into a large number of data pages 195, here in the form of roughly hexagonal or circular cells closely packed for maximizing page and hence data density. FIG. 3b illustrates, but at a much lower density than in actual practice, the individual data bits, here in the form of spots or holes in a photochemical film for representing binary data. An open hole represents a binary bit "1"; a closed hole represents the bit "0". The data bits are as densely packed as can be resolved by the optics and, in this case, the data holes of diameter d1=0.9 microns at a spacing of d2=1.5 microns as shown in the cross-section of FIG. 3c. These data holes are furthermore selected as described below so that the dispersion envelope of light from a light source having a plane wavefront that coacts with an aspect ratio of depth to width of the grating grooves on the diffractive layer creates a virtual or artificial stop in the overall optical imaging system of FIG. 1 that yields a highly resolved sharp image of the data layer on sensor array 270.

Thus with reference to FIGS. 4a, 4b and 4c, the simplex diffractive grating layer 230 has overlapping circular gratings that form a diffractive element 215, one for each of the data pages 195 and in axial registration therewith. The overlapping of the gratings is exaggerated for illustration in FIGS. 4a and 4b, but some overlap is needed because the light rays, as they propagate from the data layer 190 shown in FIG. 1, veer off axis and into a neighboring diffractive lens element 215 due to the close pack pages 195 of data layer 190. Although not discernible from FIG. 4c, the grating pattern of each of the diffractive lens elements 215 has a selected minimum depth to width aspect ratio in the grating groove that is critical to the present invention and is discussed more fully in connection with FIG. 5.

Figure 5:
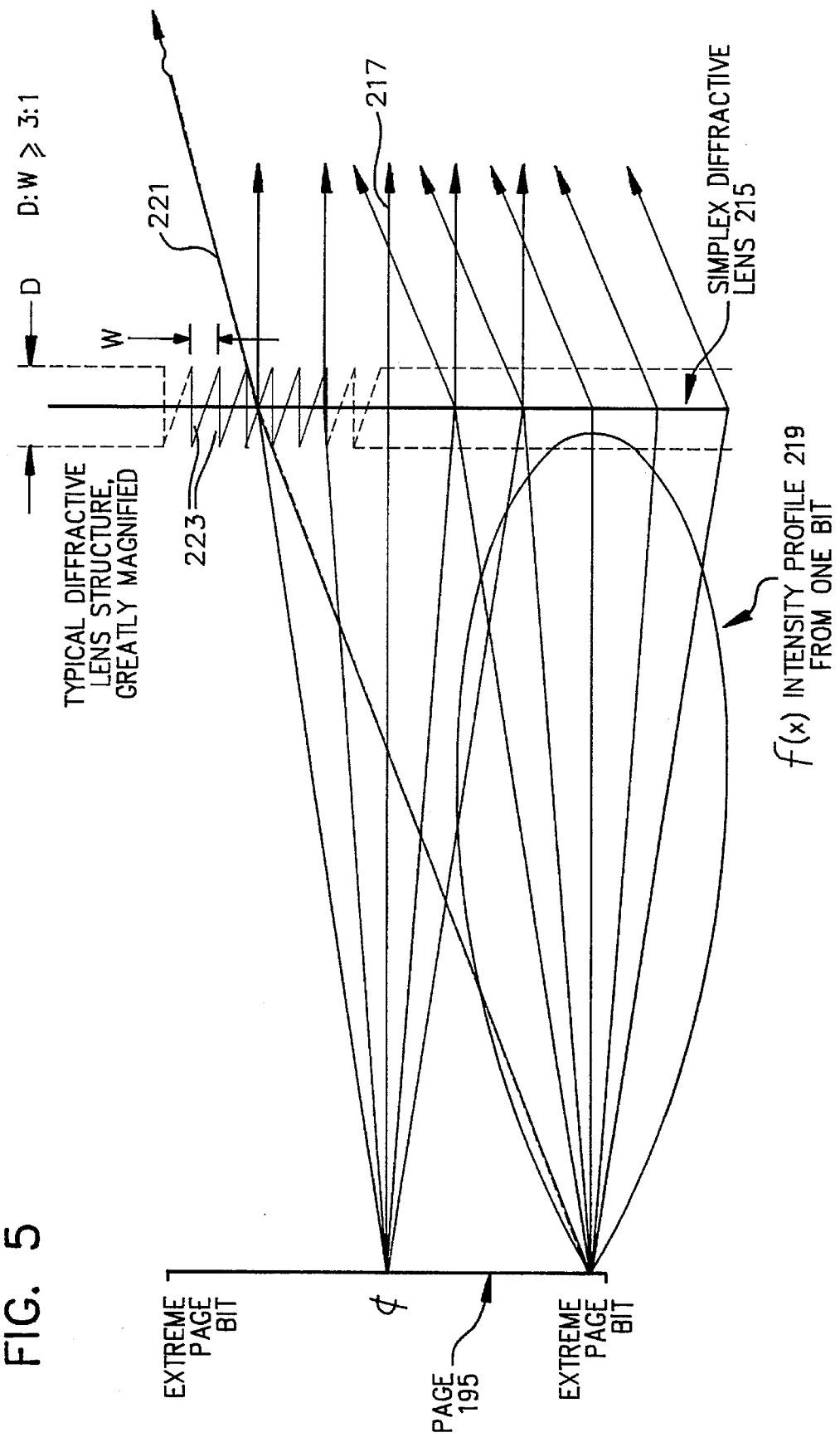
FIG. 5 is a diagrammatic view on a much enlarged scale illustrating the light rays propagating from a center bit and an extreme edge bit of a single page of data and being selectively accepted and modified by the specially shaped grating grooves for the single diffractive element for that data page.

While it is not possible to place a real physical stop at a location beyond the image in order to optimize the sharpness of the image, it is proposed in accordance with the present invention to achieve the same or similar result by creating an artificial stop by other optical structure to control the way that the bundles of data rays intersect with the diffractive lens element. More specifically, and as best illustrated in FIG. 5, the simplex diffractive lens 215 for a single page 195 is preferentially illuminated on the same side of the center line or axis 217 of the lens as the data point that is to be imaged. In the preferred embodiment this is in part achieved by using a hole size for each data bit that causes, in conjunction with the predetermined wavelength λ of the source light, an output distribution envelope or intensity profile 219 that restricts the divergence and direction of the light to attenuate or minimize those "bad" rays that would diverge and illuminate the lens on the other side of the axis 217 from the originating data bit. In other words, any light following ray path 221 as shown in FIG. 5 would be first attenuated or minimized by the intensity envelope 219 in accordance with the following function:

$$f(x) = \left[ \frac{\left(\sin\left(\frac{\pi \cdot d_1 \cdot \sin(x)}{\lambda}\right)\right)^2}{\left(\frac{\pi \cdot d_1 \cdot \sin(x)}{\lambda}\right)^2} \right] \cdot (1 + \cos(x))^2$$

$$x = -\frac{\pi}{2}, -\frac{\pi}{2} + .01 \ldots \frac{\pi}{2}$$

and λ = 0.645 microns
$d_1$ = 0.9 microns

This function defines the intensity of the envelope originating at a point source and is a function of the wavelength λ of the light source, and the diameter of the data hole. In this embodiment, a wave length of 0.645 microns is used as the source light and a data hole in page 195 is 0.9 microns. It is observed that the intensity envelope significantly attenuates light rays that diverge from the point source at an angle that in the extreme bit position of a data page would pass through the diffractive lens element 215 on the other side of center line 217. It is such diverging rays such as illustrated by dotted line 221 that are to be discriminated against in order to optimize the resulting image on the sensor array.

A second optical feature of the preferred embodiment is to fabricate the simplex diffractive lens 215 with a grating groove pattern 223 that, as shown in FIG. 5, has a greater depth than width aspect ratio and this ratio is preferably at least 3:1. Thus the three dimensional geometry of grating grooves 223 with a depth to width ratio as specified, creates an acceptance angle that discriminates against the divergent bad rays such as indicated by ray path 221 as shown in FIG. 5. While the aspect ratio of grooves 223 can be in the range of 1:1 to 4:1 or more depending upon the difference in the index of refraction from the transparent bonding material of the card through the material of diffractive lens 215, a preferred aspect ratio is as mentioned of D to W equal to or greater than 3:1. This diffraction groove aspect ratio cooperates with the elongated intensity profile of the bit hole light to further discriminate against and hence attenuate those bad light rays that if allowed to reach the sensor image plane would make an aberrated image and cause errors in the data readout.

Figure 6:
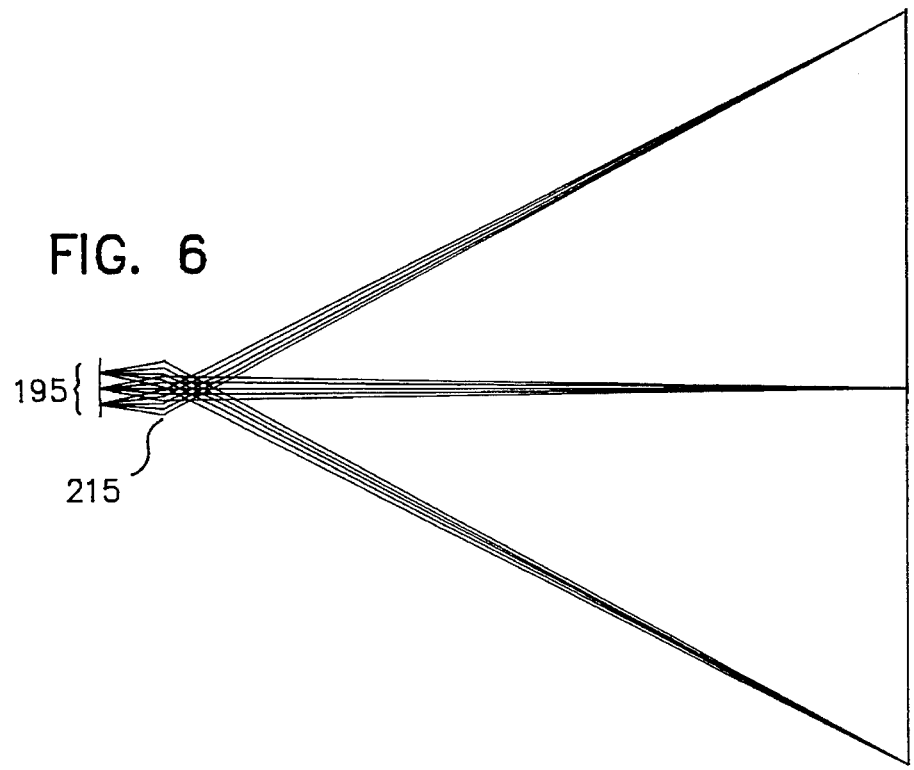
FIG. 6 is a computer generated simulation showing the data light rays from a center and opposed extreme bit locations on a single page of data as modified by the single diffractive element.

FIG. 6 is a computer generated view of the imaging effect of a single diffractive lens element 215 processing data bits on a page 195 consisting of a center bit and two extreme bits. In this illustration, the field lens has been omitted in order to more clearly show the crossing of the bundles of light rays from the extreme bit locations as they are processed by the simplex diffractive lens 215. It will be appreciated that in both the illustration in FIGS. 5 and 6, the complete operating optical random access memory has an array of pages 195 and a corresponding array of diffractive lenslets or lens 215 each in effect forming a layer of the sandwich data/lens card 170 as depicted in FIGS. 1 and 7a.

Now with reference to FIGS. 7a, and the associated addressing and control electronics in FIG. 7b, the operation of the memory 100 is described in detail in the above mentioned copending U.S. patent application Ser. No. 07/815,924 and international patent application Ser. No. PCT/US92/11356. The addressing electronics 290 may be integrated into a flat substrate and mounted as shown in FIG. 7a for accessing data from ORAM 100 by accepting addressing data from a data bus 121 connected via an interface bus 123 through an address buffer 125 to select particular rows of data after an image has been formed on sensor array 270. This is done by operating row select switches 127. To illuminate a selected data page, the address available from bus 121 includes page address data fed over x and y decode buses 131 and 133 which cause x decode 135 and y decode 137 to select a particular one of the multiple light source drivers 130 of sources 150 to illuminate a single page 195 of data for imaging onto sensor array 27. A timing control 139 provides in a manner known per se, a sequence of timing control signals identified as "pulse LED" (controls page light drivers source 130); "pulse CCD row" (controls the read-out of data from a charge coupled device sensor array 270); "gate MUX" (controls an output multiplexer from sensor array 270); and "data ready" (signals that the data is ready from the data output multiplexer and interface to a data user bus). The output of data from sensor array 270 is made available through a buffer register 141, a multiplexer 143, an interface to bus 145, and an output data bus 147.

While only particular embodiments have been disclosed herein, it will be readily apparent to persons skilled in the art that numerous changes and modifications can be made thereto, including the use of equivalent means, devices, and method steps without departing from the spirit of the invention.

I claim:

1. An optical data system including: an optical data means for storing data as light altering characteristics and being organized into a plurality (P) of juxtaposed data regions each having capacity to store (B) bits of data; controllable light source means for selectively illuminating at least one of said juxtaposed data regions of said optical data means; data imaging lens means having a plurality of juxtaposed lenslets characterized in that said lenslets are each a-diffractive surface arranged in such proximity to and in optical registration with a separate one of said juxtaposed data regions and shaped to coact with an intensity lobe of light from each data bit to form a virtual stop beyond each said lenslet to cause a uniform image of said separate one of said juxtaposed data regions on a common image surface spaced from said data means and lens means; and further including sensor means having a plurality (S) of juxtaposed light sensors arranged at said image surface for sensing data as a light image corresponding to an illuminated data region; and data signal output means coupled to said sensor means for outputting data signals representing said data of an illuminated and imaged data region.

2. The system of claim 1 further characterized by said diffractive surface having grating grooves of depth to width ratio sufficient to attenuate off axis light rays from each said data bit.

3. The system of claim 1 further characterized in that said diffractive surfaces of said lenslets comprise a plurality of overlapping grating or holographic patterns.

4. The system of claim 1 further characterized in that said diffractive surface of each of said lenslets is functionally aspherical.

5. The system of claim 1 further characterized in that said data means and said lens means are formed as a unitary layered structure so as to maintain optical registration therebetween.

6. The optical system of claim 1, further characterized in that each said lenslet has a circular grating with a groove aspect ratio chosen to restrict the acceptance angle of incidental data light rays.

7. The optical system of claim 1, wherein said optical data means comprises a layer of material having light transmissive holes to represent said (B) bits of data, each said hole having a size selected relative to a wavelength $\lambda$ of source light to produce an intensity profile of aspect ratio of 3:1.

8. An optical data system including: an optical data means for storing data as light altering characteristics and beings organized into a plurality of juxtaposed data regions each having capacity to store bits of data; controllable solid state light generator means for selectively illuminating at least one of said juxtaposed data regions of said optical data means; and data imaging lens means having a plurality of juxtaposed lenslets characterized in that each has one functionally aspherical diffractive element and is shaped and arranged in such proximity to and in optical registration with a separate one of said juxtaposed data regions so that the image resolving power thereof is substantially uniform over the field of view of that data region to form an image thereof on a common image surface spaced from said data means and lens means; and the system further including sensor means having a plurality of juxtaposed solid state light sensors arranged at said common image surface for sensing data as a light image corresponding to an illuminated data region; and data signal output means coupled to said sensor means for outputting data signals representing said stored bits of data of an illuminated and imaged data region.

9. An optical data and lens structure for an optical data system, including: a data layer for storing data as light altering characteristics and being organized into a plurality of separate data regions each containing a plurality (B) bits of data; a lens array having a plurality of lenslets disposed adjacent said data layer and each lenslet having a single diffractive lens surface defining an optical field of view respectively aligned with one of said separate data regions so that each lenslet is arranged for imaging optical data of (B) bits associated with one of said data regions; and structural bonding means interposed said data layer and said diffractive lens surfaces of said lens array so as to optically couple and mechanically fix said data layer to said lens array to form an optical and a structural unit.

10. The optical data and lens structure of claim 9 further characterized in that said structural means comprises a transparent optical layer of bonding material.

11. The optical data system of claim 1, further comprising structural means interposed said optical data means and said data imaging lens means for optically coupling and mechanically fixing said optical data means to said data imaging lens means to form a structural unit.

12. The optical data system of claim 11 further characterized in that said structural means comprises a transparent optical layer of bonding material.

\* \* \* \* \*